(12) United States Patent
Jiang et al.

(10) Patent No.: US 11,329,611 B2
(45) Date of Patent: May 10, 2022

(54) TRANSISTOR BIAS ADJUSTMENT FOR OPTIMIZATION OF THIRD ORDER INTERCEPT POINT IN A CASCODE AMPLIFIER

(71) Applicant: pSemi Corporation, San Diego, CA (US)

(72) Inventors: Rong Jiang, San Diego, CA (US); Haopei Deng, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/294,637

(22) Filed: Mar. 6, 2019

(65) Prior Publication Data

US 2020/0287505 A1    Sep. 10, 2020

(51) Int. Cl.

| | |
|---|---|
| *H03F 3/04* | (2006.01) |
| *H03F 1/22* | (2006.01) |
| *H03F 1/56* | (2006.01) |
| *H03G 3/30* | (2006.01) |
| *H03F 3/195* | (2006.01) |

(Continued)

(52) U.S. Cl.
CPC ............ *H03F 1/223* (2013.01); *H03F 1/3205* (2013.01); *H03F 1/565* (2013.01); *H03F 3/195* (2013.01); *H03F 3/21* (2013.01); *H03G 3/3042* (2013.01)

(58) Field of Classification Search
CPC .......... H03F 1/223; H03F 1/565; H03F 3/195; H03F 3/21; H03F 1/3205; H03G 3/3042
USPC ........................................ 330/296, 311, 285
See application file for complete search history.

(56) References Cited

U.S. PATENT DOCUMENTS

| | | | |
|---|---|---|---|
| 6,803,824 B2 * | 10/2004 | Rategh | H03F 1/223 330/302 |
| 7,248,120 B2 | 7/2007 | Burgener et al. | |
| 8,487,706 B2 | 7/2013 | Li et al. | |

(Continued)

FOREIGN PATENT DOCUMENTS

| | | |
|---|---|---|
| WO | 2018057096 | 3/2018 |
| WO | 2020180540 | 9/2020 |

OTHER PUBLICATIONS

Jung, Jong Han, International Search Report and Written Opinion received from the Korean Patent Office dated Jun. 24, 2020 for appln. No. PCT/US2020/019759, 9 pgs.

(Continued)

*Primary Examiner* — Khanh V Nguyen
*Assistant Examiner* — Khiem D Nguyen
(74) *Attorney, Agent, or Firm* — Jaquez Land Greenhaus & McFarland LLP; Alessandro Steinfl, Esq.

(57) ABSTRACT

Methods and devices for amplifying an input RF signal according to at least two gain-states is described. According to one aspect, a multi gain amplifier circuit including a low noise amplifier having a stack of transistors is used for amplification of the input RF signal. When switching from a low gain-state to a high gain-state, the drain-to-source voltage of the output transistor of the stack is increased to affect region of operation of the output transistor, and thereby reduce non-linearity at the output of the amplifier. When switching from the high gain-state to the low gain-state, the drain-to-source voltage of the input transistor of the stack is increased to affect region of operation of the input transistor, and thereby reduce non-linearity at the output of the amplifier.

22 Claims, 12 Drawing Sheets

(51) Int. Cl.
H03F 3/21 (2006.01)
H03F 1/32 (2006.01)

(56) References Cited

U.S. PATENT DOCUMENTS

| | | |
|---|---|---|
| 8,987,792 B2 | 3/2015 | Adamski et al. |
| 9,219,445 B2 | 12/2015 | Nobbe et al. |
| 9,929,701 B1 | 3/2018 | Noori et al. |
| 9,941,849 B1 | 4/2018 | Ayranci et al. |
| 10,110,166 B1 | 10/2018 | Noori |
| 2011/0070848 A1 | 3/2011 | Ramachandra Reddy |
| 2014/0184335 A1 | 7/2014 | Nobbe et al. |
| 2014/0184336 A1 | 7/2014 | Nobbe et al. |
| 2014/0184337 A1 | 7/2014 | Nobbe et al. |
| 2014/0253242 A1 | 9/2014 | Youssef et al. |
| 2015/0249437 A1 | 9/2015 | Morishita et al. |
| 2015/0270806 A1 | 9/2015 | Wagh et al. |

OTHER PUBLICATIONS

Jung, Jong Han, International Preliminary Report on Patentability received from the Korean Patent Office dated Jun. 2, 2021 for appln. No. PCT/US2020/019759, 6 pgs.

* cited by examiner

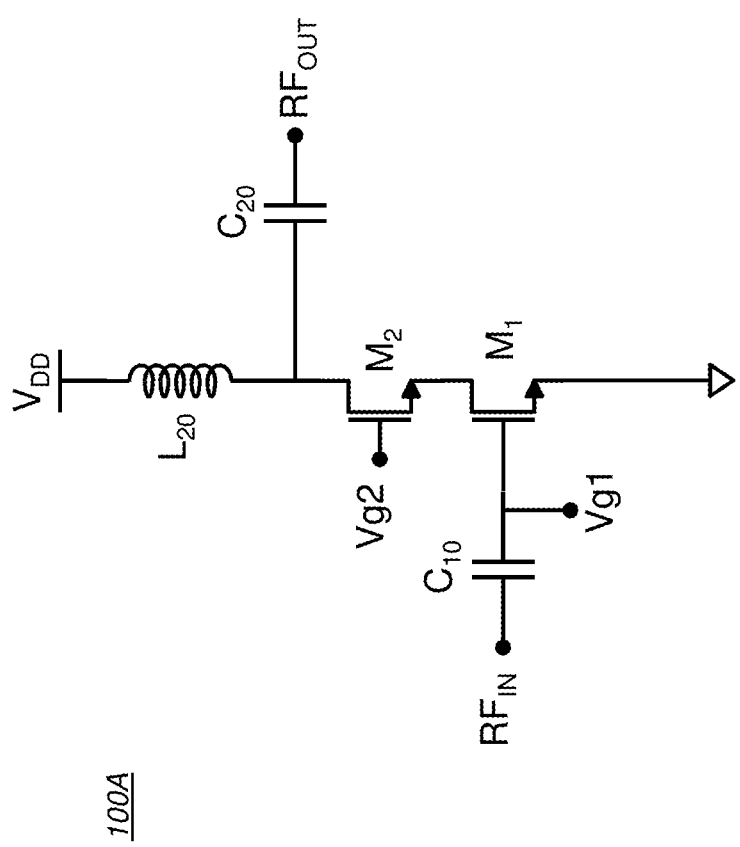
FIG. 1A  *Prior Art*

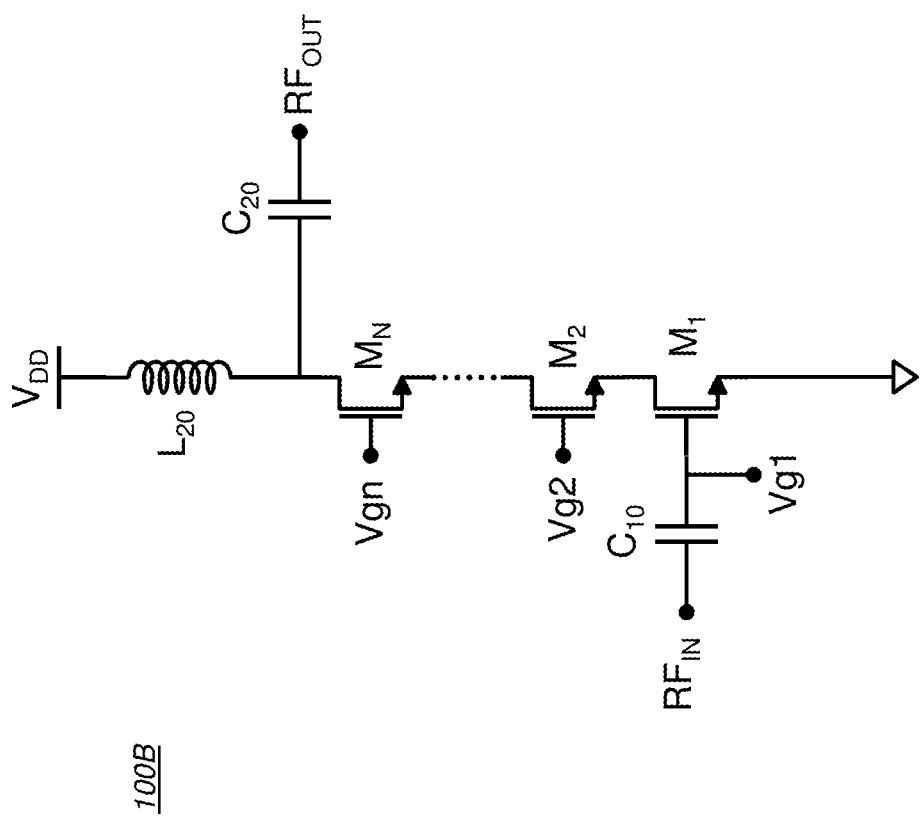
FIG. 1B *Prior Art*

TRANSISTOR BIAS ADJUSTMENT FOR OPTIMIZATION OF THIRD ORDER INTERCEPT POINT IN A CASCODE AMPLIFIER

CROSS REFERENCE TO RELATED APPLICATIONS

The present application may be related to U.S. Pat. No. 9,929,701 B1, entitled "LNA with Programmable Linearity", issued Mar. 27, 2018, the disclosure of which is incorporated herein by reference in its entirety. The present application may also be related to U.S. Pat. No. 9,941,849 B1, issued on Apr. 10, 2018, entitled "Programmable Optimized Band Switching LNA for Operation in Multiple Narrow-Band Frequency Ranges", the disclosure of which is incorporated herein by reference in its entirety. The present application may also be related to U.S. Pat. No. 10,110,166, issued on Oct. 23, 2018, entitled "LNA with Variable Gain and Switched Degeneration Inductor", the disclosure of which is incorporated herein by reference in its entirety. The present application may also be related to U.S. Pat. No. 8,987,792 B2, entitled "Merged Active Devices on a Common Substrate", issued Mar. 24, 2015, the disclosure of which is incorporated herein by reference in its entirety. The present application may also be related to U.S. Pat. No. 7,248,120 B2, issued on Jul. 24, 2007, entitled "Stacked Transistor Method and Apparatus", the disclosure of which is incorporated herein by reference in its entirety. The present application may also be related to Published US Application No. 2015/0270806 A1, published Sep. 24, 2015, entitled "Bias Control for Stacked Transistor Configuration", the disclosure of which is incorporated herein by reference in its entirety.

TECHNICAL FIELD

The present teachings relate to RF (radio frequency) circuits. More particularly, the present teachings relate to methods and apparatuses for optimizing a third order intercept point (IP3) in a cascode amplifier comprising a plurality of stacked transistors, the cascode amplifier operating according to at least two gain-states.

BACKGROUND

Radio frequency (RF) devices, such as cell phone receivers, are becoming increasingly complex due to requirements to operate according to different modes of operation associated with, for example, additional frequency bands, more complex modulation schemes, higher modulation bandwidths, and the introduction of data throughput improvement schemes such as simultaneous RF transmission and/or reception within a same or different, but closely spaced, bands or channels within a band (e.g. voice, data), and aggregate reception wherein information is multiplexed over parallel RF transmissions.

In order to support such different modes of operation, use of mode specific amplifiers may be one option, where performance of the amplifier may be tuned according to the specific mode. One such tuning may be with respect to a gain of the amplifier, wherein the gain is tuned or changed according to the specific mode of operation of the amplifier so to obtain different levels of amplification through the amplifier.

One well known amplifier configuration is a cascode configuration, wherein a plurality of series connected transistors (staked transistors comprising an input transistor and one or more cascode transistors) are used to amplify an input RF signal. FIGS. 1A and 1B respectively show a simplified schematic representation of a prior art RF amplifier using a stack of two (input transistor M1 and cascode transistor M2, wherein M2 is the output transistor) and a stack of N (input transistor M1 and cascode transistors M2, . . . , MN, wherein MN is the output transistor) series connected transistors arranged in a cascode configuration, each having a common-source input transistor M1. More description about such cascode configuration comprising stacked transistors and related biasing can be found, for example, in the above referenced U.S. Pat. Nos. 8,987,792 B2, 7,248,120 B2 and US 2015/0270806 A1, the disclosures of which are incorporated herein by reference in their entirety.

As shown in the exemplary amplifier configuration (100C) of FIG. 1C, a degeneration inductor, $L_{DEG}$, may be coupled to a source node of the input transistor M1 of a stack of transistors operating as an amplifier. A person skilled in the art is well aware of such configuration and associated benefits, including benefits for input impedance matching as well as for a linearity performance and noise figure performance of the amplifier configuration (100C). In particular, such benefits make the amplifier configuration (100C) a design choice for implementations of, for example, low noise amplifiers (LNAs) used, for example, in the receiver section of an RF front-end communication system (e.g., 200 shown in FIG. 2).

The LNA is responsible for providing a first stage amplification to a signal received by the communication system. The operational specifications of the LNA are important to the overall quality of the receiver section of the communication system. Any noise or distortion introduced by the LNA may cause degradation in the overall receiver performance. That is, the sensitivity of a receiver may be in large part determined by the quality of the LNA. The sensitivity of the receiver, in turn, may determine the amount of information that can be transmitted (e.g., via a transmitter) in a predetermined amount of time (e.g., the bit rate in bits per second) at a predetermined bit error rate.

The quality of an LNA is often times characterized by parameters such as the gain, linearity (i.e., third-order intercept point (IP3), as measured by either input IP3 (IIP3) or output IP3 (OIP3), and the 1 dB compression point (P1 dB)), noise figure (NF), input impedance match, output impedance match, and the power consumption (i.e., supply voltage and current). These characteristics indicate the amount of distortion likely to be imposed on signals received and processed by the receiver section of the communication system, how strong a signal needs to be, and the signal-to-interference-plus-noise ratio (SINR) required to recover information transmitted at a particular data rate. As demand continues to grow for ever higher data rates, such higher data rates may require greater accuracy in the demodulation of signals received by the receiver. Limitations on the amount of gain that can be applied without imposition of excessive distortion to the received signal can limit the data rate at which information modulated on a signal can be accurately demodulated from the signal once received.

In the case of receivers used in wireless communication systems (e.g., 200 shown in FIG. 2), such as receivers within cellular phones, such receivers must also be capable of handling a wide range of input signal levels. Accordingly, LNAs used in such receivers may have programmable gain, current, and/or linearity. In addition, such LNAs are expected to meet certain input and output matching requirements as well as gain, linearity, and noise figure for each of the programmable gain-state. Some exemplary implementations of such LNAs having programmable gains and/or linearity control can be found, for example, in the above referenced U.S. Pat. Nos. 9,929,701 B1, 9,941,849 B1 and 10,110,166 B1, the disclosures of which are incorporated herein by reference in their entirety. As can be taken from such references, gain and linearity adjustment of the LNAs may be provided via adjustable bias current levels through the stacked transistors of the LNAs, and/or via adjustable/switchable attenuator stages coupled to the input and/or output of the LNAs, and/or via adjustable/switchable capacitances coupled to gates and/or sources of stacked transistors of the LNAs, and/or via adjustable/switchable degeneration impedances coupled to input transistors of the stacked transistors of the LNAs.

As a number of adjustable/switchable elements used in optimizing linearity performance of the LNAs with respect to different gain-states of the LNAs may require increased complexity in design, optimization, and physical layout of a corresponding circuit, there may be a need to reduce such complexity. It follows that an object of the present disclosure is to provide a simple solution for optimization of linearity performance with respect to different gain-states of an LNA without a need for such adjustable/switchable elements.

SUMMARY

Teachings according to the present disclosure are based on Applicant's observation that major contributor to non-linearity, and therefore IP3, in a low gain-state of the LNA is the input transistor (e.g. M1 of FIG. 1C), whereas major contributor to non-linearity in a high gain-state of the LNA is the output transistor (e.g., M2 of FIG. 1C). Based on such observation and according to the various embodiments of the present disclosure, optimization of the LNA performance for reduction of non-linearity, and therefore increased IP3, can be provided by increasing drain-to-source voltage of the input transistor of the stack while operating in the low gain-state, and by increasing drain-to-source voltage of the output transistor while operating in the high gain-state. According to further embodiments of the present disclosure, such control of the drain-to-source voltages can be provided by controlling of the gate voltage to a first cascode transistor of the stack that is coupled to the input transistor, and/or controlling of the gate voltage to a last cascode transistor of the stack that is the output transistor. In a case wherein the LNA comprises a stack of two transistors, an input transistor and a cascode output transistor, optimization of the LNA performance for reduction of non-linearity can be provided by controlling the gate voltage to the cascode output transistor so to provide a larger proportion of a supply voltage to the stack across drain and source nodes of the input transistor when switching from operation in the high gain-state to operation in the low gain-state, and controlling the gate voltage to the cascode output transistor so to provide a larger proportion of the supply voltage to the stack across drain and source nodes of the output transistor when switching from operation in the low gain-state to operation in the high gain-state.

According to a first aspect of the present disclosure, a multi-gain-state amplifier circuit for operation according to at least a low gain-state and a high gain-state is presented, the multi gain amplifier circuit comprising: i) a low noise amplifier (LNA) comprising: a stack of a plurality of series connected transistors comprising an input transistor and one or more cascode transistors comprising an output transistor, the stack coupled between a substantially fixed supply voltage and a reference ground; and ii) a gain decoder and bias control circuit that is configured to selectively generate biasing voltages to gates of the one or more cascode transistors for operation according to the low gain-state and the high gain-state, wherein: when switching from the low gain-state to the high gain-state, the biasing voltages increase a drain-to-source voltage of the output transistor for operation according to the high-gain-state, and when switching from the high gain-state to the low gain-state, the biasing voltages increase a drain-to-source voltage of the input transistor for operation according to the low-gain-state.

According to a second aspect of the present disclosure, a method for optimizing a third order intercept point (IP3) in a multi-gain-state amplifier comprising at least a low gain-state and a high gain-state is presented, the method comprising: when operating in the low-gain state, biasing cascode transistors of the multi-gain-state amplifier for an optimized value of the IP3; when operating in the high-gain state, biasing cascode transistors of the multi-gain-state amplifier for an optimized value of the IP3; wherein when switching from the low gain-state to the high gain-state, the optimized value of the IP3 when operating in the high-gain state is obtained by increasing a drain-to-source voltage of an output transistor, wherein when switching from the high gain-state to the low gain-state, the optimized value of the IP3 when operating in the low gain-state is obtained by increasing a drain-to-source voltage of an input transistor, and wherein the multi-gain-state amplifier comprises a low noise amplifier (LNA) comprising a stack of a plurality of series connected transistors comprising the input transistor and one or more cascode transistors comprising the output transistor, the stack coupled between a substantially fixed supply voltage and a reference ground.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a simplified schematic representation of a prior art RF common source amplifier circuit using a stack of two series connected transistors arranged in a cascode configuration.

FIG. 1B shows a simplified schematic representation of a prior art RF common source amplifier circuit using a stack of a plurality (N) series connected transistors arranged in a cascode configuration.

DETAILED DESCRIPTION

Figure 1C:
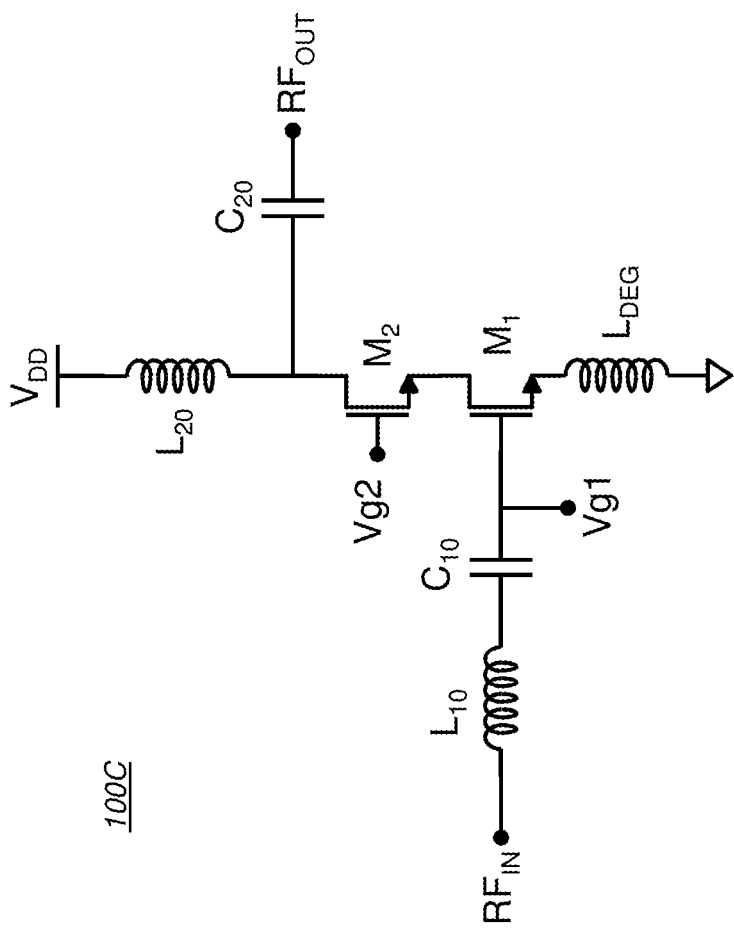
FIG. 1C shows a simplified schematic representation of a prior art common source degenerated amplifier configuration based on the cascode configuration of FIG. 1A.

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits (circuital arrangements) in electronics devices (e.g., cell phones, radios) having a plurality of devices, such as for example, transistors (e.g., MOSFETs). Persons skilled in the art will appreciate that such electrical circuits comprising transistors can be arranged as amplifiers.

The term "amplifier" as used in the present disclosure is intended to refer to amplifiers comprising stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers, in particular stacked transistor amplifiers operating as a cascode configuration, are described for example in U.S. Pat. No. 7,248,120, issued on Jul. 24, 2007, entitled "Stacked Transistor Method and Apparatus", the disclosure of which is incorporated herein by reference in its entirety. As used herein, the term "amplifier" can also be applicable to amplifier modules and/or power amplifier modules having any number of stages (e.g., pre-driver, driver, final), as known to those skilled in the art. As used herein the term "low noise amplifier" or "LNA" are intended to refer to an amplifier comprising a degeneration impedance that comprises an inductor. It is possible that the techniques in this invention apply to a common gate input topology as well.

FIG. 1A shows a simplified schematic representation of a prior art RF amplifier circuit (100A) using a stack of two series connected transistors, (M1, M2), arranged in a cascode configuration. As can be seen in FIG. 1A the RF amplifier (100A) comprises an input transistor, M1, and an output (cascode) transistor, M2, that are connected in series. Such RF amplifier (100A) using a stack configuration is well known to a person skilled in the art and widely discussed in the above references whose disclosures are incorporated herein by reference in their entirety. In particular, the person skilled in the art is well aware of a principle of operation of the cascode configuration shown in FIG. 1A, which is beyond the scope of the present disclosure.

With continued reference to FIG. 1A, an input RF, $RF_{IN}$, provided at a gate terminal of the input transistor M1 of the amplifier (100A) through a coupling capacitor, C10, is amplified by the amplifier (100A). A corresponding amplified output RF signal, $RF_{OUT}$, is provided at a drain of the output transistor, M2, and routed to an output terminal of the amplifier through a coupling capacitor, C20. Coupling capacitors C10 and C20 can be used to decouple low frequency (e.g., DC) biasing voltages provided to the stack of transistors (transistor stack) from the $RF_{IN}$ and $RF_{OUT}$ signals. A supply voltage, $V_{DD}$, is provided to the drain of the output transistor, M2, through an inductor, L20, and a reference voltage (e.g., GND) is connected to a source of the input transistor M1. The supply voltage $V_{DD}$ may be fixed or a substantially fixed regulated voltage.

Biasing voltages at nodes (Vg1, Vg2) of the RF amplifier (100A) are provided to respective gates of the stacked transistors (M1, M2). Such biasing voltages may be used to bias respective transistors according to desired operating conditions (e.g. points), or even to completely deactivate (i.e. substantially no current conduction) the respective transistors in cases, for example, where the amplifier (100A) is not used (e.g. standby mode of operation). In particular, as known to a person skilled in the art, biasing voltage Vg1 to the gate of the input transistor may establish a DC current through the stacked transistors and therefore an output power (e.g., gain) of the RF amplifier (100A). Various biasing circuits to generate such biasing voltages to the RF amplifier (100A) are described, for example, in the above referenced U.S. Pat. Nos. 9,219,445, 8,487,706 B2, Published US Application No. 2014/0184335 A1, Published US Application No. US 2014/0184336 A1, Published US Application No. 2014/0184337 A1, and Published US Application No. 2015/0270806.

FIG. 1B shows a simplified schematic representation of a prior art RF amplifier circuit (100B) using a stack of a plurality (N) series connected transistors (M1, . . . , MN) arranged in a cascode configuration. Principle of operation of the configuration (100B) is similar to one described above with respect to the configuration (100A) of FIG. 1A. A person skilled in the art would understand that a larger stack height of the RF amplifier, defined by the integer number N, where N=2, 3, 4, . . . , 8, . . . , can allow for a larger voltage at the drain of the output transistor, MN, as such voltage can be distributed among the N stacked transistors. Distribution of the voltage at the drain of the output transistor, MN, can in turn limit a voltage across any two nodes (source, drain, gate) of a transistor of the stack to within a safe operating range (e.g. within a withstand voltage of the transistors).

Figure 1D:
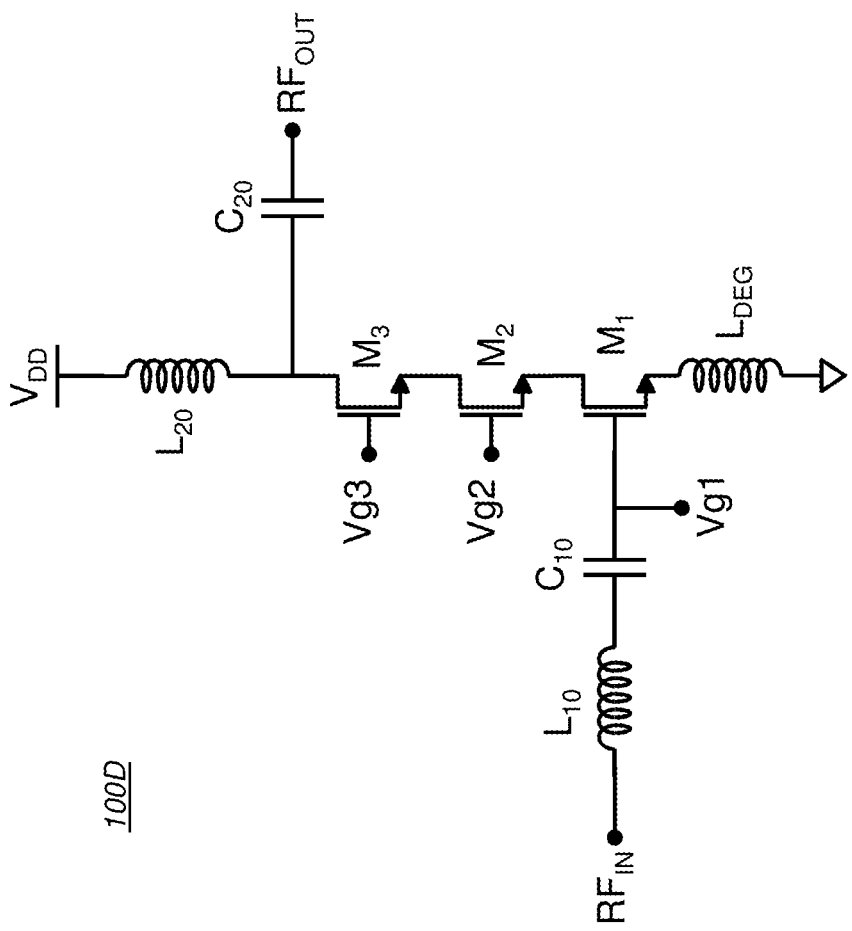
FIG. 1D shows a simplified schematic representation of a prior art common source degenerated amplifier configuration based on the cascode configuration of FIG. 1B for a case of three series connected transistors.
Figure 2:
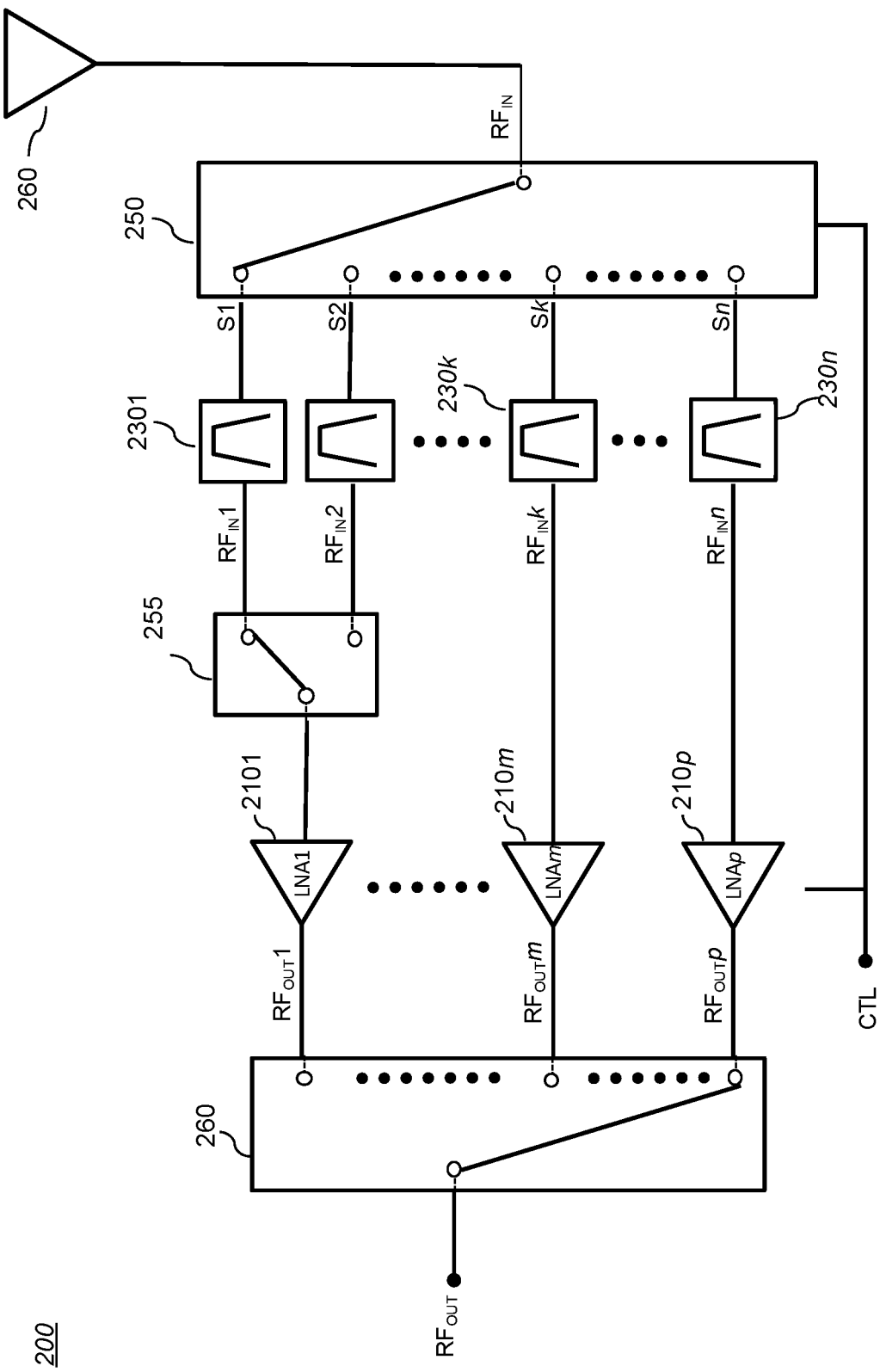
FIG. 2 shows a block diagram of receive paths of a prior art multi-mode RF front-end communication system of an RF device, as used, for example, in a cellular phone, where band specific low noise amplifiers (LNAs) are used in corresponding receive paths.

FIG. 1C shows a simplified schematic representation of an exemplary prior art common source degenerated amplifier configuration (100C). Such exemplary configuration uses the amplifier (100A) with coupling of the source node of the input transistor, M1, to ground via a degeneration inductor, $L_{DEG}$, and coupling of the input RF signal, $RF_{IN}$, to the coupling capacitor, C10, via an input inductor, L10. As described above, the amplifier configuration (100C) is a design choice for implementation of the LNAs used, for example, in receive paths of an RF system as depicted in FIG. 2 later described. It should be noted that a number of stacked transistors of the configuration (100C) can be an integer number N, where N=2, 3, 4, . . . , 8, as described above with reference to FIG. 1B, in dependence, for example, of a maximum voltage at the drain node of the output transistor. FIG. 1D shows one exemplary case where N=3.

FIG. 2 shows a simplified block diagram of a prior art RF front-end communication system (200) which can be used for RF reception of multiple modes and multiple frequency bands signals via an antenna (260). A person skilled in the art would realize that the block diagram depicted in FIG. 2 may also include transmit paths (not shown) coupled to antenna (260) for RF transmission of the multiple modes and multiple frequency band signals via the same antenna (260).

As can be seen in FIG. 2, an antenna switch (250) may be used to switch an input RF signal, $RF_{IN}$, detected at the antenna, (260), to one of a plurality of selectable receive paths, each comprising, for example, a filter (2301, ..., 230n) and a low noise amplifier, LNA, (2101, ..., 210p), where each of the plurality of selectable receive paths processes the detected $RF_{IN}$ signal according to a corresponding mode and/or band of operation. An output processed by each of the receive paths can be selectively routed for downstream processing (e.g. via a transceiver, not shown) by way of an output switch (260). Control of the antenna switch (250) and the output switch (260) through control signal, CTL, may be provided via a controller that is aware of a selected mode and/or band of operation of the RF front-end communication system (200), such as, for example, a transceiver unit (not shown). In some cases, as shown in FIG. 2, a same LNA (e.g., 2101) may be used to selectively process, via for example a switch (255), the detected RF signal, $RF_{IN}$ for processing according to different modes and/or frequency bands.

As described above, in order to support a wide range of RF signal levels, the LNAs (2101, ..., 210p) of the system (200) may have programmable gains. As used herein, a programmable gain refers to capability of an amplifier, such as an LNA, to be selectively configured to operate in one of at least two gain-states, each gain-state corresponding to a different amplification of an input signal to the amplifier, provided at an output of the amplifier. Accordingly, a multi-gain-state amplifier can refer to a programmable gain amplifier having a plurality, N, of gain-states, N being an integer number equal to or larger than two.

Figure 3:
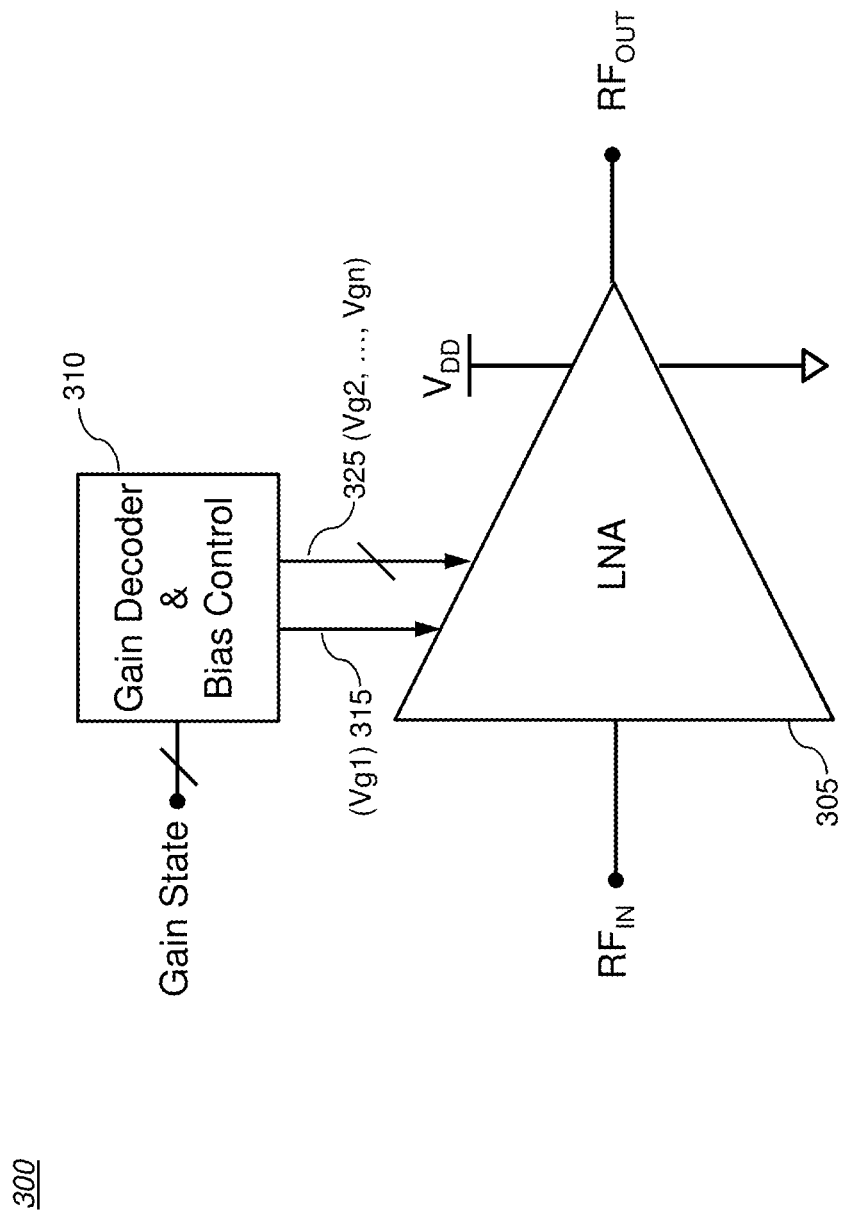
FIG. 3 shows a block diagram, according to an exemplary embodiment of the present disclosure, of a multi-gain-state amplifier circuit comprising an LNA.

FIG. 3 shows a block diagram of a multi-gain amplifier circuit (300) according to an embodiment of the present disclosure. As can be seen in FIG. 3, the multi-gain amplifier circuit (300) comprises a low noise amplifier, LNA (305), comprising an input terminal for receiving an input RF signal, $RF_{IN}$, and an output terminal for outputting an amplified version, $RF_{OUT}$, of the input RF signal. According to a further embodiment of the present disclosure, control of an amplification level (gain) of the multi-gain amplifier circuit (300) is provided by a block (310) that is configured to generate gate biasing voltages (315, 325) to transistors of the LNA (305) responsive to an input control signal, GainState, to the block (310).

With continued reference to FIG. 3, according to an exemplary embodiment of the present disclosure, the multi-gain amplifier circuit (300) may be controlled to operate according to at least a low gain-state and a high gain-state. According to some non-limiting exemplary embodiments of the present disclosure, the low gain-state may correspond to a gain ($RF_{OUT\_POWER}/RF_{IN\_POWER}$) of about 6 dB or lower, and the high gain-state may correspond to a gain of about 16 dB or higher. According to some embodiments of the present disclosure, the block (310) according to the present teachings can function as a gain decoder and bias control circuit that decodes a target gain-state for the LNA (305) from the input control signal, GainState, and generates corresponding gate biasing voltages (315, 325) to operate the LNA (305) according to the target gain-state while minimizing/reducing non-linearities (e.g., increasing IP3) at the output of the LNA (325) specific to the target gain-state.

A person skilled in the art would clearly understand that the input control signal, GainState, to the multi-gain amplifier circuit (300) of FIG. 3, may be one or more analog signals, one or more digital signals, or a combination thereof, so long that a desired and unique gain-state from a plurality of gain-states of the multi-gain amplifier circuit (300) can be described/encoded by the GainState signal and accurately/uniquely decoded by a gain-state decoder circuit (labelled as Gain Decoder in FIG. 3) within the block (310).

With further reference to the multi-gain amplifier circuit (300) of FIG. 3, the block (310) may generate the gate biasing voltages (315, 325) so to: a) configure the LNA (305) according to a gain-state (amplification level) represented by the input control signal, GainState, and b) minimize/reduce non-linearities at the output RF signal, $RF_{OUT}$, associated to different biasing conditions (e.g., biasing voltages to) of the LNA (305) for providing of the gain-state. As described above, such non-linearities may be based on the IP3 parameter value as measured from either the input IP3 (IIP3) or the output IP3 (OIP3).

According to some exemplary embodiments of the present disclosure, the gate biasing voltage (315) may control the gain of the LNA (305), via for example control of a quiescent (DC) current through the LNA (305), and the gate biasing voltages (325) may control/minimize the non-linearities specific to the gain. It is noted that gate biasing voltages (325) may also change to some extent the current through the LNA (305), but with less efficiency when compared to the gate biasing voltage (315). According to further embodiments of the present disclosure, generation of voltage levels of such gate biasing voltages (315, 325) for each of the multiple programmable amplification levels of the multi-gain amplifier circuit (300) may be provided by first decoding the input control signal, GainState, and then, based on the decoding, generating corresponding levels of the gate biasing voltages (315, 325). It should be noted that a person skilled in the art may know of many circuits for generating such voltage levels based on a decoded gain-state. Some non-limiting exemplary circuits may use a combination of one or more of analog-to-digital conversion circuits, digital-to-analog conversion circuits, digital circuits, analog circuits, and memory circuits that take the decoded input control signal, GainState, and generate appropriate and corresponding levels of the gate biasing voltages (315, 325). According to a preferred embodiment of the present disclosure, the input control signal, GainState, may be a digital signal that uniquely specifies a gain-state from the plurality of gain-states supported by the multi-gain amplifier circuit (300).

Figure 4A:
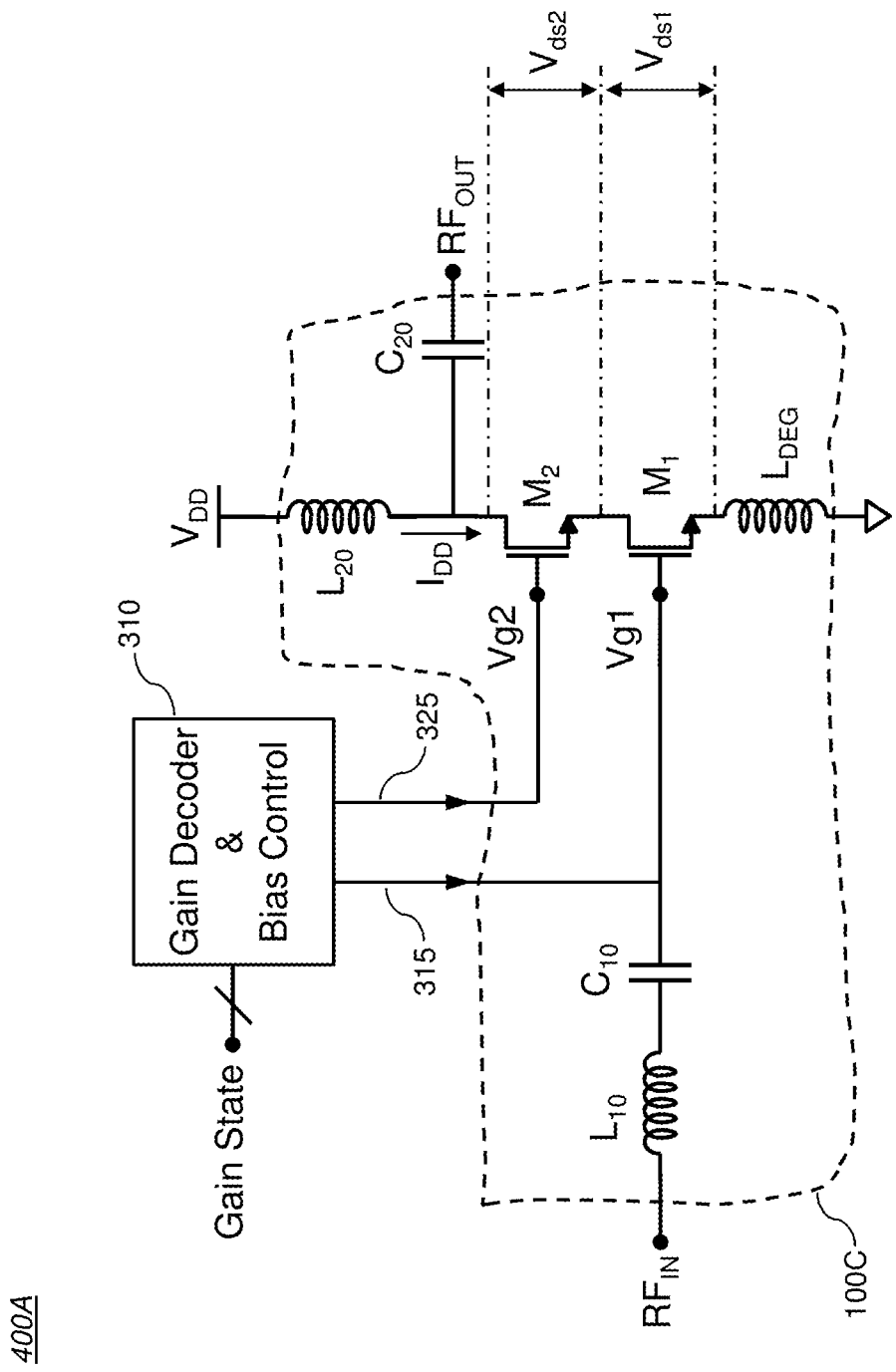
FIG. 4A shows an exemplary embodiment according to the present disclosure of the multi-gain-state amplifier circuit shown in FIG. 3 wherein the LNA is the common-source degenerated amplifier of FIG. 1C.

FIG. 4A shows an exemplary embodiment (400A) according to the present disclosure of the multi-gain-state amplifier circuit shown in FIG. 3 wherein the LNA (305) is the common-source degenerated amplifier (100C) of FIG. 1C comprising a stack of two transistors: an input transistor M1 whose source is coupled to a reference voltage (e.g., GND) through the degeneration inductor, $L_{DEG}$, and an output cascode transistor M2 whose drain is coupled, through an inductor, L20, to the supply voltage $V_{DD}$. It would be clear to a person skilled in the art, that the gate biasing voltage Vg2 and the supply voltage $V_{DD}$, in combination, determine drain-to-source voltages Vds1 and Vds2 for each of the transistors M1 and M2. In particular, for a substantially fixed/regulated level of the supply voltage $V_{DD}$, the drain-to-source voltages Vds1 and Vds2 are largely determined by the gate biasing voltage Vg2.

Figure 4B:
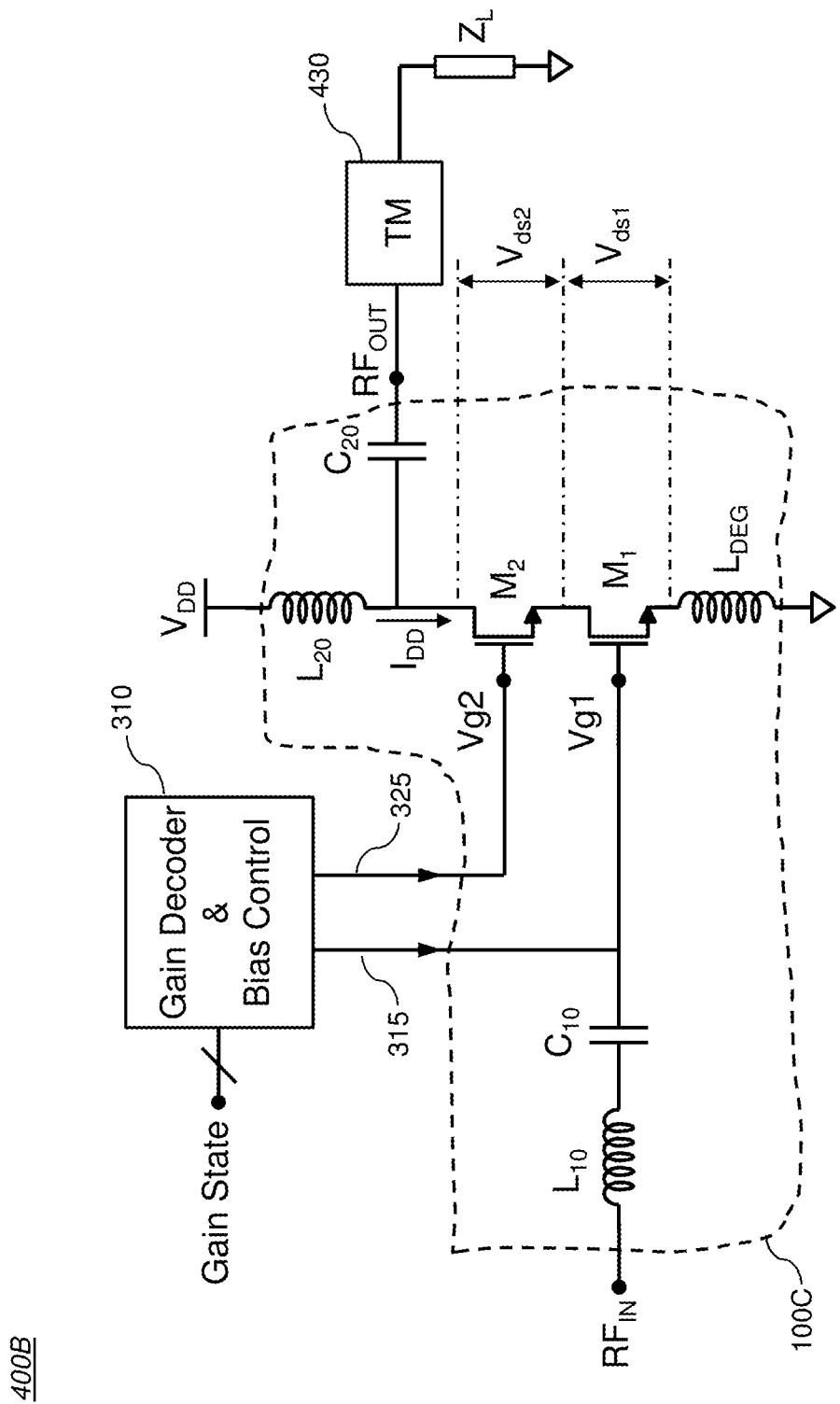
FIG. 4B shows an exemplary embodiment according to the present disclosure of the multi-gain-state amplifier circuit shown in FIG. 4A wherein an output of the LNA is coupled to an impedance matching circuit.

As can be seen in FIG. 4A, the gate biasing voltage (315) provides biasing to the gate of the input transistor, M1, and the gate biasing voltage (325) provides biasing to the gate of the cascode output transistor, M2. As described above, the gate biasing voltage (315) may control the gain (e.g., quiescent current $I_{DD}$) of the LNA (100C) and the gate biasing voltage (325) may control/reduce non-linearities at the output RF signal, $RF_{OUT}$. It should be noted that according to some exemplary embodiments, and as shown in FIG. 4B, the output of the LNA (100C) may be coupled to an impedance matching circuit, (430), that is designed to match an output impedance of the LNA (100C) to a load impedance, $Z_L$. In such case, if desired, the gate biasing voltage (315, 325) may be set to control gain and control/reduce non-linearities at the load $Z_L$. In addition, as it is well known in the art, the impedance matching circuit (430) may be a tunable circuit that can be tuned based not only on, for example, a mode and/or a frequency band of operation associated to the received RF signal, $RF_{IN}$, but also based on the gain of the LNA (100C).

With continued reference to FIG. 4A, Applicant of the present disclosure has observed that dominant contributor to non-linearity, and therefore IP3, in a low gain-state of the LNA (100C) is the input transistor, M1, whereas the dominant contributor to non-linearity in a high gain-state of the LNA is the output transistor, M2. Such flip in contribution to the non-linearity between operation in the low and high gain-states may be due to the presence of the degeneration inductor (impedance), $L_{DEG}$. It is noted that in general, the degeneration inductor LDEG may affect linearity and relative contributions of M1 and M2 for different gain-states. A person skilled in the art would clearly realize that although the source of the cascode transistor M2 is not directly connected to the degeneration inductance, $L_{DEG}$, the source of M2 effectively sees a degeneration impedance that is based on an output impedance of M1, which is partly based on the degeneration inductance, $L_{DEG}$, but that is also based on a region of operation (e.g., as set by an I-V curve) of the input transistor M1. As the region of operation of the input transistor M1 may change based on the gain-state of the LNA (100C), in this case based on the gate biasing voltage Vg1, it follows that, as observed by Applicant, contribution to the non-linearity from the cascode transistor M2 may be different, and more or less with respect to contribution from the input transistor M1, based on the gain of the LNA (100C). Having identified the main contributor to non-linearity (e.g., IP3) between the low gain-state and the high gain-state of the LNA (100C), Applicant has determined, through simulation and circuit analysis, a range of values of the gate biasing voltage Vg2 that reduces the non-linearity. Representative graphs are shown in FIG. 4C, for a high gain-state, and in FIG. 4D for a low gain-state.

Figure 4C:
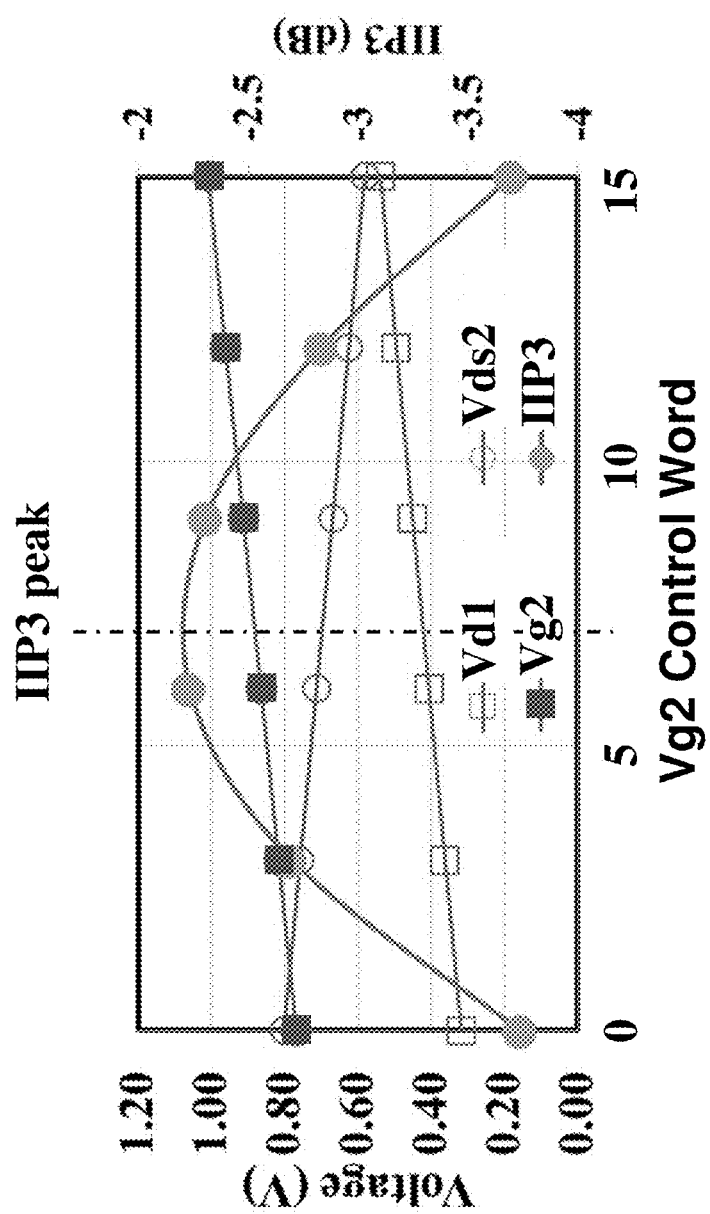
FIG. 4C shows graphs representing input IP3 of the multi-gain-state amplifier circuit of FIG. 4A for a high gain-state as a function of a varying gate voltage to the output transistor of the amplifier.

FIG. 4C shows graphs representing IIP3 (i.e. input IP3) of the multi-gain-state amplifier circuit (400A) of FIG. 4A for a high gain-state of the amplifier circuit (400A) as a function of a varying gate voltage, Vg2, to the output (cascode) transistor, M2, of the amplifier, and for a fixed supply voltage, $V_{DD}$, equal to 1.2 volts. According to one non-limiting embodiment, the varying of the gate voltage, Vg2, may be provided via a Vg2_Control signal (e.g., byte, word or other digital code) that in the exemplary case of the graphs depicted in FIG. 4C may vary in discrete steps from a value of 0 to a value of 15 to control the Vg2 voltage to vary from about 0.78 volts to about 1 volt. Such control of Vg2 may be provided within the block (310) either as part of the input control signal, GainState, or via separate control signal not shown in the figures. A person skilled in the art would realize that for a substantially fixed supply voltage $V_{DD}$, varying the gate voltage, Vg2, would also cause, as shown in FIG. 4C, a same variation of the drain voltage, Vd1, of the input transistor M1. Finally, since the supply voltage is substantially fixed (e.g., regulated), varying of the drain voltage, Vd1, would also cause a same variation (same amplitude, opposite sign) of the drain-to-source voltage, Vds2, of M2, as shown in FIG. 4C, and a complementary variation of the drain-to-source voltage, Vds1, of M1, such that at all time, Vds1+Vds2=$V_{DD}$.

With further reference to FIG. 4C, as described above, in the high gain-state, the non-linearity (e.g. IP3) is dominated by the cascode transistor, M2. Accordingly, reduction of the non-linearity contributed by the cascode device, M2, may be based on the impedance seen by the source of M2 (i.e., degeneration impedance), and/or a region of operation of M2. As can be seen in FIG. 4C, by sweeping the Vg2_Control signal from 0 to 15, which causes the gate voltage, Vg2, to vary (linearly) from about 0.78 volts to 1 volt, IIP3 improves (higher value indicative of lower non-linearity) with the first swept values of Vg2_Control and drops with the last swept values. When Vg2_Control is equal to 0, the drain voltage Vd1 is low and therefore the input transistor, M1, operates near its triode region of operation. When operating in the triode region of operation, M1 has a low output impedance and therefore the cascode transistor, M2, sees a lower degeneration impedance which can contribute to higher non-linearity (lower IIP3). As the gate voltage, Vg2, increases with higher values of Vg2_Control, and therefore higher values of Vd1, region of operation of the input transistor, M1, gradually transits from triode to saturation region, and as a consequence the output impedance of the input transistor, M1, increases substantially (at least an order of magnitude). In turn, the cascode device, M2, sees a higher degeneration impedance which in turn lowers non-linearity contributed by M2 (higher IIP3), with a peak value of IIP3 observed at a value of 7 of Vg2_Control (i.e., Vg2 of about 0.88 volts). Finally, further increasing of the gate voltage, Vg2, with even higher values of Vg2_Control, causes a difference between the gate-to-source voltage, Vgs2, of M2, and the drain-to-source voltage, Vds2, of M2, to decrease, and as a consequence driving M2 to operate closer to its triode region of operation which directly contributes to more non-linear components, and therefore a degradation of IIP3 per the graph of FIG. 4C is observed.

Figure 4D:
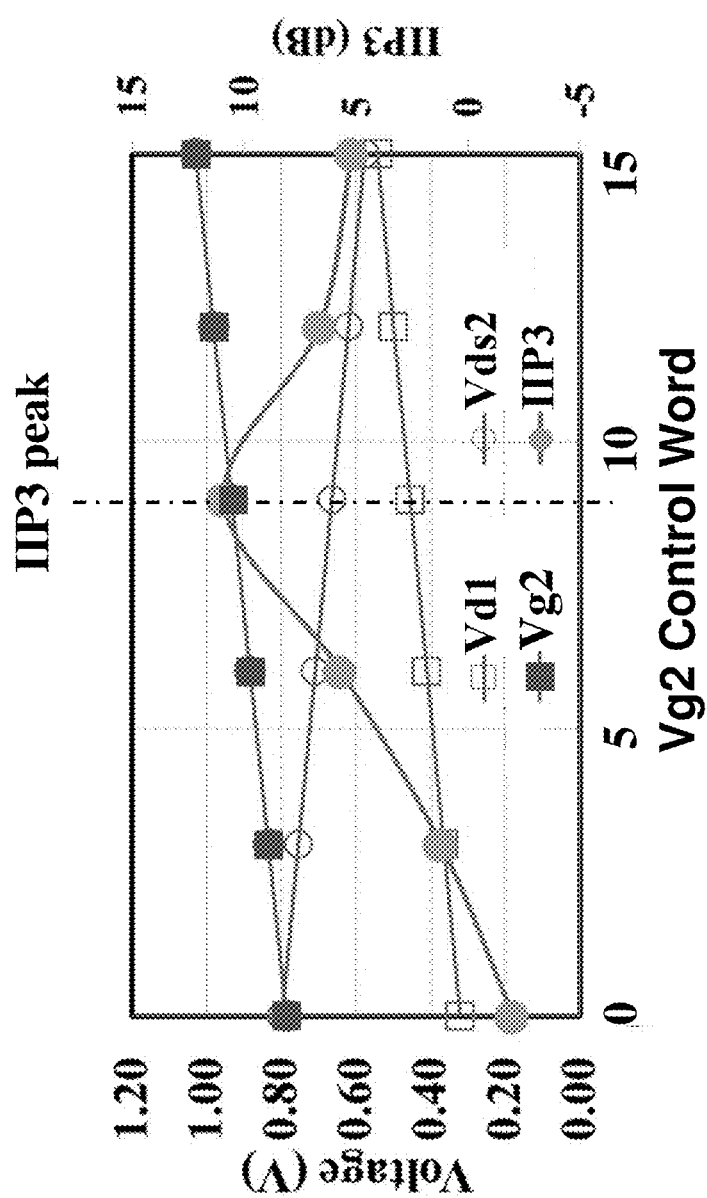
FIG. 4D shows graphs representing input IP3 of the multi-gain-state amplifier circuit of FIG. 4A for a low gain-state as a function of a varying gate voltage to the output transistor of the amplifier.

FIG. 4D shows graphs representing IIP3 (i.e. input IP3) of the multi-gain-state amplifier circuit (400A) of FIG. 4A for a low gain-state of the amplifier circuit (400A) as a function of a varying gate voltage, Vg2, to the output (cascode) transistor, M2, of the amplifier, and for a fixed supply voltage, $V_{DD}$, equal to 1.2 volts. The graphs of FIG. 4D represent the same parameters as in graphs of FIG. 4C described above but for a case of the low gain-state. As described above, the varying of the gate voltage, Vg2, may be provided via the Vg2_Control signal that is swept, for example, from a value of 0 to a value of 15.

With further reference to FIG. 4D, as described above, in the low gain-state, the non-linearity (e.g. IP3) is dominated by the input device, M1. Different from the case of M2 in the high gain-state described above with reference to FIG. 4C, the source (degeneration) impedance of M1 is pure passive (i.e., $L_{DEG}$) and is not affected by an output impedance of M1.

Accordingly, reduction of the non-linearity contributed by the input device, M1, may be based solely on a region of operation of M1. As can be seen in FIG. 4D, by sweeping the Vg2_Control signal from 0 to 15, which causes the gate voltage, Vg2, to vary from about 0.78 volts to 1 volt, IIP3 improves (higher value indicative of lower non-linearity) substantially with the first swept values of Vg2_Control to reach a peak at a value of Vg2_Control equal to 9 (i.e., Vg2 of about 0.92 volts) and drops with the last swept values (e.g., Vg2_Control between 10-15). Overall, one can observe that for drain voltages, Vd1, higher than about 0.4 volts (i.e., Vg2_Control equal to or larger than 6), better IP3 performance (higher values of IIP3) are obtained compared to drain voltages, Vd1, lower than 0.4 volts (i.e., Vg2_Control between 0-5).

With continued reference to FIG. 4D, when Vg2_Control is equal to 0 (lower gate voltage Vg2), Vd1 is low, the input transistor, M1, operates in its triode region of operation, and therefore directly contributes to more non-linear components that cause a degradation of IIP3 as shown in the graph of FIG. 4D. As the gate voltage, Vg2, increases (Vg2_Control>0 to 9) with higher values of Vg2_Control, and therefore higher values of Vd1, region of operation of the input transistor, M1, gradually transits from triode to saturation region, and as a consequence lowers its contribution to non-linearity for better IP3 performance. With further increase (Vg2_Control>9) of the gate voltage, Vg2, and therefore further increase of the drain voltage, Vd1, non-linear components of the cascode transistor, M2, are affected and as a consequence M2 directly contributes to more non-linear components, and therefore a degradation of IIP3 per the graph of FIG. 4D is observed. It should be noted that description according to the present paragraph relates to observed effects that can be controlled and have an impact on linearity. However, a person skilled in the art would clearly understand that that there may be other contributors to linearity of an RF amplifier that are not described in the present disclosure.

With reference to FIG. 4C and FIG. 4D, it would be clear to a person skilled in the art that in order to reduce non-linearity, or to maintain non-linearity to a lower possible value, a lower Vg2 value (e.g., corresponding to Vg2_Control=7) should be used in the high gain-state and a higher Vg2 value (e.g., corresponding to Vg2_Control=9) should be used in the low gain-state of the multi-gain-state amplifier circuit (400A). It follows that according to an embodiment of the present disclosure, the block (310) of FIG. 4A, increases the gate biasing voltage, Vg2, when switching from a high gain-state to a low gain-state, and decreases the gate biasing voltage, Vg2, when switching from the low gain-state to the high gain-state. Accordingly, the drain voltage, Vd1, and therefore the drain-to-source voltage Vds1, of the input transistor, M1, is increased when switching from the high gain-state to the low gain-state and is decreased when switching from the low gain-state to the high gain-state. Similarly, since Vds1+Vds2 is constant, the drain-to-source voltage Vds2, of the output cascode transistor, M2, is decreased when switching from the high gain-state to the low gain-state and is increased when switching from the low gain-state to the high gain-state.

Since in the high gain-state the dominant contributor to the non-linearity is the output cascode transistor, M2, and in the low gain-state the dominant contributor to the non-linearity is the input transistor, M1, based on the above, a person skilled in the art would clearly understand that the block (310) of the present teachings generates the gate biasing voltage, Vg2, so to increase the drain-to-source voltage of the one transistor that is the dominant contributor to the non-linearity when switching gain-states. In other words, when switching from the low gain-state to the high gain-state where the output cascode transistor, M2, is the dominant contributor, the drain-to-source voltage, Vds2, of M2 is increased, and when switching from the high gain-state to the low gain-state where the input transistor, M1, is the dominant contributor, the drain-to-source voltage, Vds1, of M1 is increased. Naturally, in the exemplary case of a stack of two transistors, such as the stack (M1, M2) per FIG. 4A, since Vds1+Vds2 is constant, increasing or decreasing one of Vds1 and Vds2 would invariably affect the other one by a same amount (but of opposite sign).

As Vds1 and Vds2 respectively impact the region of operation of M1 and M2, the present teachings describe changing/affecting the region of operation of the one device that is the dominant contributor to the non-linearity in a target switching gain-state. In other words, when switching from the low gain-state to the high gain-state where the output cascode transistor, M2, is the dominant contributor, the region of operation of M2 is changed to be more into the saturation region, and when switching from the high gain-state to the low gain-state where the input transistor, M1, is the dominant contributor, the region of operation of M1 is changed to be more into the saturation region. Furthermore, it should be noted that in the high gain-state, when M2 is fully into the saturation region, the source impedance seen by M2 becomes important as well, so does the working region (region of operation) of M1. Accordingly, a trade-off between Vds1 and Vds2 may be provided.

Figure 5:
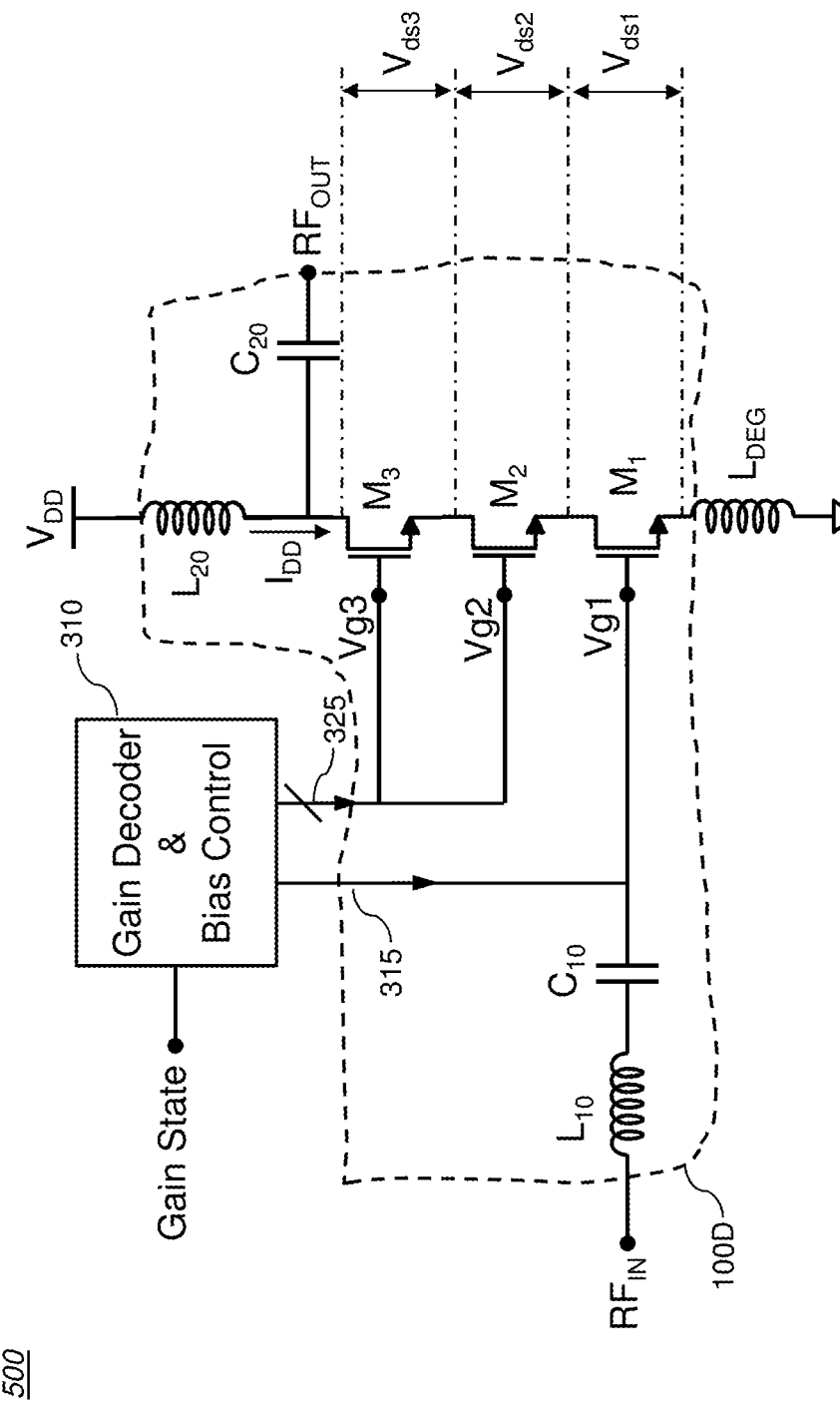
FIG. 5 shows an exemplary embodiment according to the present disclosure of the multi-gain-state amplifier circuit shown in FIG. 3 wherein the LNA is a common-source degenerated amplifier comprising a stack of three series connected transistors arranged in a cascode configuration.

As described above, the teachings according to the present disclosure may equally apply to configurations wherein the LNA comprises more than two series connected transistors. FIG. 5 shows an exemplary embodiment (500) according to the present disclosure of the multi-gain-state amplifier circuit shown in FIG. 3 wherein the LNA (305) is the common-source degenerated amplifier (100D) of FIG. 1D comprising a stack of three series connected transistors (M1, M2, M3) arranged in a cascode configuration. As can be seen in FIG. 5, the multi-gain-state amplifier circuit (500) comprises an input transistor M1 whose source is coupled to a reference voltage (e.g., GND) through the degeneration inductor, $L_{DEG}$, and cascode transistors M2 and M3 that are in series connection. The transistor M3 being an output cascode transistor, is coupled, through an inductor, L20, to the supply voltage $V_{DD}$. It would be clear to a person skilled in the art, that the gate biasing voltages Vg2 and Vg3, in combination with the supply voltage $V_{DD}$, determine drain-to-source voltages Vds1, Vds2 and Vds3 for each the transistors M1, M2 and M3. In particular, for a substantially fixed/regulated level of the supply voltage $V_{DD}$, the drain-to-source voltages Vds1, Vds2 and Vds3 are determined by the gate biasing voltages Vg2 and Vg3.

With continued reference to FIG. 5, similar to the case of a stack of two described above with reference to FIG. 4A, Applicant of the present disclosure has observed that major contributor to non-linearity, and therefore IP3, in a low gain-state of the LNA (100D) is the input transistor, M1, whereas major contributor to non-linearity in a high gain-state of the LNA (100D) is the output transistor, M3. In other words, the middle cascode transistor, M2, does not substantially affect non-linearity (e.g., IP3) in either the low or the high gain-state of the LNA (100D), and therefore, the middle cascode transistor, M2, may be used as means to isolate effects of control voltages (e.g., Vg2, Vg3) to M1 and M3 used to reduce gain-state non-linearity. In other words, as gain-state non-linearity may be reduced by changing drain-to-source voltages Vds1 and Vds3, the drain-to-source, Vds2, of the middle transistor, M2, can be used as a buffer between Vds1 and Vds3, so that Vds1 and Vds3 can freely and independently be used to control regions of operation of M1 and M3, and therefore reducing respective non-linearity, without affecting one another. This is different from the case of the stack of two transistors described with reference to FIG. 4A, wherein Vds1 and Vds2 are intrinsically related. As a consequence, more freedom in controlling a respective region of operation of M1 and M3, and possibly more reduction of a corresponding non-linearity for a target gain-state, can be obtained. A person skilled in the art would clearly realize that an amount of freedom may be limited by an available headroom imposed by a level of the supply voltage, $V_{DD}$. In other words, a higher level of the supply voltage, $V_{DD}$, may provide for more freedom in control of respective regions of operation of M1 and M3 without affecting operation of M2, whereas a lower level of the supply voltage may constrain control of the respective regions of operation due to a possible limited Vds2.

With continued reference to FIG. 5, since in the high gain-state the dominant contributor to the non-linearity is the output cascode transistor, M3, and in the low gain-state the dominant contributor to the non-linearity is the input transistor, M1, based on the above, a person skilled in the art would clearly understand that the block (310) of the present teachings generates the gate biasing voltage, Vg2, so to increase the drain-to-source voltage, Vds1, of the input transistor M1 when switching from the high gain-state to the low gain-state, and generates the gate biasing voltage, Vg3, so to increase the drain-to-source voltage, Vds3, of the output cascode transistor M3 when switching from the low gain-state to the high gain-state. As the control of Vds1 and Vds3 may be provided independently due to the presence of the middle cascode transistor, M2, further tweaking of Vds1 when switching to the high gain-state and of Vds3 when switching to the low gain-state may be provided. Such further switching may be to adjust, if needed, other performances of the multi gain amplifier circuit (500).

As Vds1 and Vds3 respectively impact the region of operation of M1 and M3, the present teachings describe changing/affecting the region of operation of the one device that is the dominant contributor to the non-linearity in a target switching gain-state. In other words, when switching from the low gain-state to the high gain-state where the output cascode transistor, M3, is the dominant contributor, the region of operation of M3 is changed to be more into the saturation region, and when switching from the high gain-state to the low gain-state where the input transistor, M1, is the dominant contributor, the region of operation of M1 is changed to be more into the saturation region.

Figure 6:
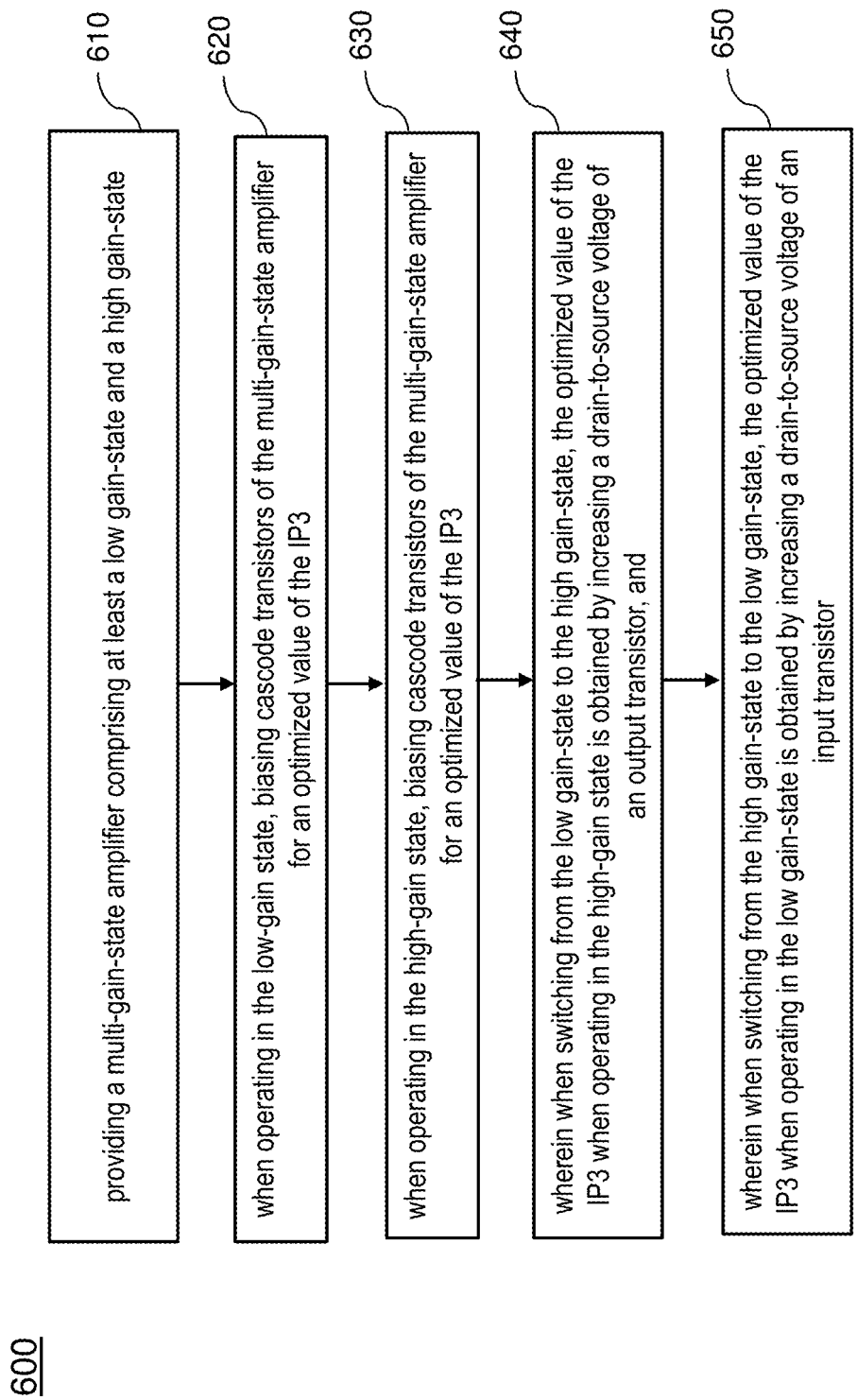
FIG. 6 is a process chart showing a method for optimizing a third order intercept point (IP3) in a multi-gain-state amplifier comprising at least a low gain-state and a high gain-state.

FIG. 6 is a process chart (600) showing various steps of a method for optimizing a third order intercept point (IP3) in the multi-gain-state amplifier according to the present teachings. As can be seen in the process chart (600), the method comprises: providing a multi-gain-state amplifier comprising at least a low gain-state and a high gain-state, per step (610); when operating in the low-gain state, biasing cascode transistors of the multi-gain-state amplifier for an optimized value of the IP3, per step (620), when operating in the high-gain state, biasing cascode transistors of the multi-gain-state amplifier for an optimized value of the IP3, per step (630), wherein when switching from the low gain-state to the high gain-state, the optimized value of the IP3 when operating in the high-gain state is obtained by increasing a drain-to-source voltage of an output transistor, per step (640), and wherein when switching from the high gain-state to the low gain-state, the optimized value of the IP3 when operating in the low gain-state is obtained by increasing a drain-to-source voltage of an input transistor, per step (650).

Based on the above description, a person skilled in the art would realize that the multi gain amplifier circuits described above may be used not only in reception paths of multi-band and/or multi-mode RF communication systems, but in any RF system where it is desired to amplify one or more (weak) RF signals according to different gains.

Reduced layout size advantage provided by the configurations according to the present teachings may allow further reduction of a monolithically integrated circuit using such configurations. A person skilled in the art would realize that monolithic integration of any of the configurations described above, either in their entireties or partially, may be possible as well, depending on desired implementation goals.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A multi-gain-state amplifier circuit for operation according to at least a low gain-state and a high gain-state, the multi-gain-state amplifier circuit comprising:
   i) a low noise amplifier (LNA) comprising:
      a stack of a plurality of series connected transistors comprising an input transistor and one or more cascode transistors comprising an output transistor, the stack coupled between a substantially fixed supply voltage and a reference ground; and
   ii) a gain decoder and bias control circuit that is configured to selectively generate biasing voltages to gates of the one or more cascode transistors for operation according to the low gain-state and the high gain-state,
   wherein during operation in the high gain-state, the biasing voltages are configured to provide a drain-to-source voltage of the output transistor that is higher than a drain-to-source voltage of the output transistor during operation in the low gain-state, and
   wherein during operation in the low gain-state, the biasing voltages are configured to provide a drain-to-source voltage of the input transistor that is higher than a drain-to-source voltage of the input transistor during operation in the high gain-state.

2. The multi-gain-state amplifier circuit according to claim 1, wherein:
   the higher drain-to-source voltage of the output transistor reduces a non-linearity of an RF signal amplified by the LNA during operation in the high-gain-state, and
   the higher drain-to-source voltage of the input transistor reduces a non-linearity of the RF signal amplified by the LNA during operation in the low-gain-state.

3. The multi-gain-state amplifier circuit according to claim 2, wherein the non-linearity comprises a third order intercept point (IP3) that increases when the non-linearity decreases.

4. The multi-gain-state amplifier circuit according to claim 1, wherein:
   the one or more cascode transistors consist of one cascode transistor that is the output transistor,
   the gain decoder and bias control circuit is configured to decrease a biasing voltage to a gate of the output transistor to provide the higher drain-to-source voltage of the output transistor during the operation in the the high gain-state, and
   the gain decoder and bias control circuit is configured to increase the biasing voltage to the gate of the output transistor to provide the higher drain-to-source voltage of the input transistor during the operation in the low gain-state.

5. The multi-gain-state amplifier circuit according to claim 4, wherein the substantially fixed supply voltage is a regulated voltage equal to about 1.2 volts.

6. The multi-gain-state amplifier circuit according to claim 1, wherein:
   the one or more cascode transistors comprise the output transistor and at least one additional cascode transistor coupled to the input transistor, and
   the gain decoder and bias control circuit is configured to decrease a biasing voltage to a gate of the output transistor to provide the higher drain-to-source voltage of the output transistor during the operation in the high gain-state.

7. The multi-gain-state amplifier circuit according to claim 1, wherein:
   the one or more cascode transistors comprise the output transistor and at least one additional cascode transistor coupled to the input transistor, and
   the gain decoder and bias control circuit is configured to increase a biasing voltage to a gate of the at least one additional cascode transistor to provide the higher drain-to-source voltage of the input transistor during the operation in the low gain-state.

8. The multi-gain-state amplifier circuit according to claim 1, wherein:
   the one or more cascode transistors comprise the output transistor and at least one additional cascode transistor coupled to the input transistor,
   the gain decoder and bias control circuit is configured to decrease a biasing voltage to a gate of the output transistor to provide the higher drain-to-source voltage of the output transistor during said operation in the high gain-state, and
   the gain decoder and bias control circuit is configured to increase a biasing voltage to a gate of the at least one additional cascode transistor to provide the higher drain-to-source voltage of the input transistor during said operation in the low gain-state.

9. The multi-gain-state amplifier circuit according to claim 8, wherein the substantially fixed supply voltage is a regulated voltage equal to about 1.8 volts.

10. The multi-gain-state amplifier circuit according to claim 2, wherein:
    during said operation in the high gain-state, the biasing voltages drive the input transistor further into a corresponding saturation region of operation so to increase a degeneration impedance seen by the output transistor for a reduction of the non-linearity.

11. The multi-gain-state amplifier circuit according to claim 1, wherein a gain of the multi-gain-state amplifier during operation in the low gain-state is equal to or smaller than 6 dB and said gain during operation in the high-gain-state is equal to or larger than 16 dB.

12. The multi-gain-state amplifier circuit according to claim 1, wherein a respective gain of the multi-gain-state amplifier during operation in the low gain-state and high-gain-state is provided via a biasing voltage to a gate of the input transistor that is selectively generated by the gain decoder and bias control circuit.

13. The multi-gain-state amplifier circuit according to claim 1, wherein the gain decoder and bias control circuit selectively generates the biasing voltages based on an input control signal that is one of: a) a digital signal, b) an analog signal, and c) a combination of a) and b).

14. The multi-gain-state amplifier circuit according to claim 13, wherein the gain decoder and bias control circuit comprises:
   a) a gain decoder circuit that decodes the input control signal into a target gain-state comprising the low gain-state or the high gain-state; and
   b) a bias control circuit that generates the biasing voltages based on the target gain-state, the bias control circuit comprising one or more of: b1) an analog-to-digital conversion circuit, b2) a digital-to-analog conversion circuit, b3) a digital circuit, b4) an analog circuit, and b5) a memory circuit.

15. The multi-gain-state amplifier circuit according to claim 1, wherein transistors of the plurality of series connected transistors are metal-oxide-semiconductor (MOS) field effect transistors (FETs).

16. The multi-gain-state amplifier circuit according to claim 9, wherein said transistors are fabricated using one of: a) silicon-on-insulator (SOI) technology, b) silicon-on-sapphire (SOS) technology, and c) bulk silicon (Si) technology.

17. An electronic module comprising the multi-gain-state amplifier circuit of claim 1.

18. A radio-frequency (RF) front-end communication system, comprising:
   a receiver section for receiving an RF signal, the receiver section comprising the electronic module of claim 17.

19. A method, comprising:
   using of the electronic module of claim 17 in one or more electronic systems comprising: a) a television, b) a cellular telephone, c) a personal computer, d) a workstation, e) a radio, f) a video player, g) an audio player, h) a vehicle, i) a medical device, and j) other electronic systems.

20. A method for optimizing a third order intercept point (IP3) in a multi-gain-state amplifier comprising at least a low gain-state and a high gain-state, the method comprising:
   during operation in the low-gain state, biasing cascode transistors of the multi-gain-state amplifier for an optimized value of the IP3;
   during operation in the high-gain state, biasing cascode transistors of the multi-gain-state amplifier for an optimized value of the IP3;
   wherein the optimized value of the IP3 during operation in the high-gain state is obtained by providing a drain-to-source voltage of an output transistor that is higher than a drain-to-source voltage of the output transistor during operation in the low gain-state,
   wherein the optimized value of the IP3 during operation in the low gain-state is obtained by providing a drain-to-source voltage of an input transistor that is higher than a drain-to-source voltage of the input transistor during operation in the high gain-state, and
   wherein the multi-gain-state amplifier comprises a low noise amplifier (LNA) comprising a stack of a plurality of series connected transistors comprising the input transistor and one or more cascode transistors comprising the output transistor, the stack coupled between a substantially fixed supply voltage and a reference ground.

21. The multi-gain-state amplifier circuit according to claim 1, wherein the low noise amplifier (LNA) is a single stage amplifier.

22. A multi-gain-state amplifier circuit for operation according to at least a low gain-state and a high gain-state, the multi-gain-state amplifier circuit comprising:
   i) a low noise amplifier (LNA) comprising:
      a stack of a plurality of series connected transistors comprising an input transistor and one or more cascode transistors comprising an output transistor, the stack coupled between a substantially fixed supply voltage and a reference ground; and
   ii) a gain decoder and bias control circuit that is configured to selectively generate biasing voltages to gates of the one or more cascode transistors for operation according to the low gain-state and the high gain-state,
   wherein during operation in the high gain-state, the biasing voltages are configured to provide a drain-to-source voltage of the output transistor that is higher than a drain-to-source voltage of the output transistor during operation in the low gain-state,
   wherein the gain decoder and bias control circuit selectively generates the biasing voltages based on an input control signal that is one of: a) a digital signal, b) an analog signal, or c) a combination of a) and b), and
   wherein the gain decoder and bias control circuit comprises:
      a gain decoder circuit that decodes the input control signal into a target gain-state comprising the low gain-state or the high gain-state; and
      a bias control circuit that generates the biasing voltages based on the target gain-state, the bias control circuit comprising one or more of: p) an analog-to-digital conversion circuit, q) a digital-to-analog conversion circuit, r) a digital circuit, s) an analog circuit, or t) a memory circuit.

* * * * *